United States Patent
Nasuno et al.

(10) Patent No.: US 7,915,612 B2
(45) Date of Patent: Mar. 29, 2011

(54) PHOTOELECTRIC CONVERSION DEVICE AND METHOD OF PRODUCING THE SAME

(75) Inventors: Yoshiyuki Nasuno, Kashihara (JP); Yasuaki Ishikawa, Fujiidera (JP); Takanori Nakano, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 514 days.

(21) Appl. No.: 11/970,043

(22) Filed: Jan. 7, 2008

(65) Prior Publication Data
US 2008/0179702 A1    Jul. 31, 2008

(30) Foreign Application Priority Data
Jan. 29, 2007   (JP) .................................. 2007-018413

(51) Int. Cl.
*H01L 31/061* (2006.01)
(52) U.S. Cl. ...... 257/52; 257/53; 257/458; 257/E31.061

(58) Field of Classification Search .................... 257/52, 257/53, 458, E31.061
See application file for complete search history.

(56) References Cited

FOREIGN PATENT DOCUMENTS

| | | |
|---|---|---|
| JP | 2000-183377 A | 6/2000 |
| JP | 2000-252495 | 9/2000 |
| JP | 2002-9313 | 1/2002 |
| JP | 2003-142705 A | 5/2003 |
| JP | 2004-6537 A | 1/2004 |

OTHER PUBLICATIONS

Japanese Office Action mailed Mar. 17, 2009 in corresponding Japanese application 2007-018413.
Japanese Office Action mailed Sep. 29, 2009 in corresponding Japanese application 2009-119018.

*Primary Examiner* — Minh-Loan T Tran
(74) *Attorney, Agent, or Firm* — Nixon & Vanderhye P.C.

(57) ABSTRACT

A photoelectric conversion device includes a p-type layer, an i-type layer and an n-type layer each made of a silicon base semiconductor, stacked in this order, wherein the i-type layer contains n-type impurities in a concentration of $1.0 \times 10^{16}$ to $2.0 \times 10^{17}$ cm$^{-3}$.

5 Claims, 6 Drawing Sheets

PHOTOELECTRIC CONVERSION DEVICE AND METHOD OF PRODUCING THE SAME

CROSS-REFERENCE TO RELATED APPLICATION

This application is related to Japanese Patent Application No. 2007-18413 filed on Jan. 29, 2007, whose priority is claimed and the disclosure of which is incorporated by reference in its entirety.

BACKGROUND OF THE INVENTION

1. Field Of The Technology

The technology presented herein relates to a photoelectric conversion device and a method of producing the same, and more particularly to a photoelectric conversion device such as a solar cell, a sensor or the like produced by a plasma CVD method or the like, and a method of producing the same.

2. Description of the Related Art

In recent years, thin-film photoelectric conversion devices which are formed from gases as a raw material by a plasma CVD method receive attention. Examples of such thin-film photoelectric conversion devices include silicon base thin-film photoelectric conversion devices including a silicon base thin-film, thin-film photoelectric conversion devices including CIS (CuInSe$_2$) compounds or CIGS (Cu (In, Ga) Se$_2$) compounds, and the like, and development of these devices are accelerated and their quantity of production is increasingly enlarged. A major feature of these photoelectric conversion devices lies in a fact that these devices have potential that cost reduction and higher performance of the photoelectric conversion device can be simultaneously achieved by stacking a semiconductor layer or a metal electrode film on a low-cost substrate with a large area with a formation apparatus such as a plasma CVD apparatus or a sputtering apparatus, and then separating/connecting photoelectric conversion devices prepared on the same substrate by laser patterning.

In the case of producing such photoelectric conversion devices, it is common to use a plasma CVD apparatus having a plurality of film forming chambers in which semiconductor layers with different conductive types are formed in different film forming chambers. As such an apparatus, an in-line method or multi-chamber system is adopted. However, it is common that these apparatuses are large in size and complicated. Therefore, increasing production cost of photoelectric conversion devices due to the increased cost of a production apparatus is a barrier to large-scale widespread use of photoelectric conversion devices.

In view of these problems, Japanese Unexamined Patent Publication No. 2000-252495 discloses a single chamber system in which a p-type semiconductor layer, an i-type crystalline silicon base photoelectric conversion layer and an n-type semiconductor layer are formed in order in succession in the same plasma CVD forming chamber. In this method, the number of the film forming chambers can be reduced and equipment can be simplified in comparison with the in-line method and the multi-chamber system. Further, there is an advantage that delivery between the film forming chambers becomes unnecessary and a production time of the photoelectric conversion device is also reduced.

A method (a single chamber system) disclosed in Japanese Unexamined Patent Publication No. 2000-252495 is a method of forming semiconductor layers of a tin film photoelectric conversion device, in which a photoelectric conversion device having a p-type semiconductor layer, an i-type semiconductor layer and an n-type semiconductor layer is formed in the same film forming chamber by a plasma CVD method. In the formation method, there is a problem that since determinant impurity atoms of a conductive type with which the p-type semiconductor layer and n-type semiconductor layer are doped, are introduced into other different kinds of semiconductor layers, a photoelectric conversion device having good photoelectric conversion characteristics is hard to obtain. In particular, when determinant impurity atoms of a conductive type of a p-type or an n-type mix in the i-type semiconductor layer, a carrier concentration increases, and therefore an internal electric field near a p-i interface or a i-n interface in the i-type semiconductor layer is weakened. This is a large cause of deterioration of the photoelectric conversion characteristics.

SUMMARY OF THE INVENTION

The present technology has been made in view of the above-discussed points and it is a feature of the present technology to provide a photoelectric conversion device having good photoelectric conversion efficiency, and a method of producing the same.

A photoelectric conversion device of the present technology includes a p-type layer, an i-type layer and an n-type layer each made of a silicon base semiconductor, stacked in this order, wherein the i-type layer contains n-type impurities in a concentration of $1.0 \times 10^{16}$ to $2.0 \times 10^{17}$ cm$^{-3}$.

The present inventors have performed earnest investigations, and consequently found that by containing n-type impurities in a concentration of $1.0 \times 10^{16}$ to $2.0 \times 10^{17}$ cm$^{-3}$ in the i-type layer, a photoelectric conversion device having excellent photoelectric conversion efficiency can be attained. As a result, the present technology has been completed.

Here, in this specification, an n-conductive type and a p-conductive type are referred to as an "n-type" and a "p-type", respectively. In addition, an n-type impurity atom and a p-type impurity atom are referred to as an "n-type impurity" and a "p-type impurity", respectively.

DESCRIPTION OF THE PREFERRED EMBODIMENTS

Figure 1:
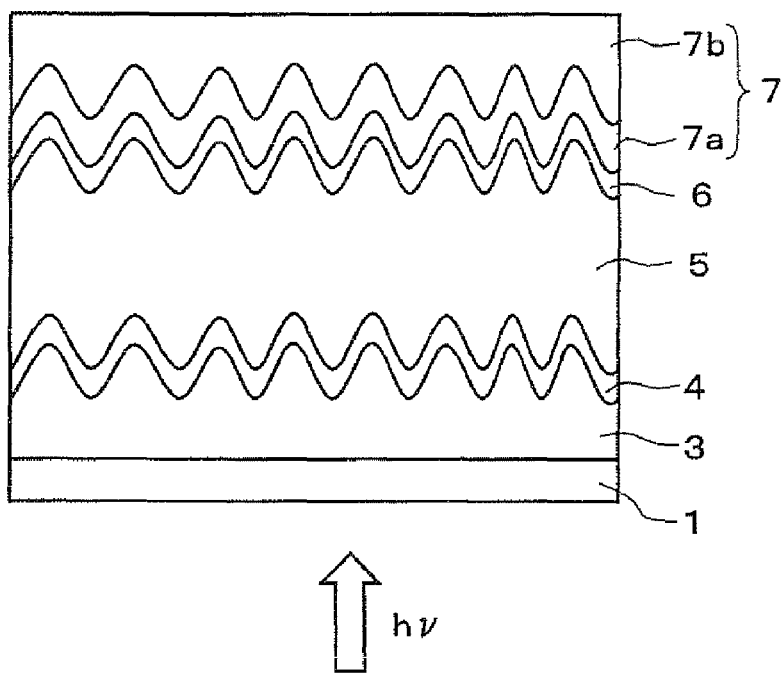
FIG. 1 is a sectional view showing a constitution of a photoelectric conversion device of a first embodiment.

A photoelectric conversion device of an embodiment includes a p-type layer, an i-type layer and an n-type layer made of a silicon base semiconductor, stacked in this order, wherein the i-type layer contains n-type impurities in a concentration of $1.0 \times 10^{16}$ to $2.0 \times 10^{17}$ cm$^{-3}$.

Hereinafter, various embodiments will be exemplified.

A plurality of sets of the p-type layer, the i-type layer and the n-type layer may be stacked.

In this case, the photoelectric conversion efficiency can be further enhanced.

The present technology also provides a method of producing a photoelectric conversion device, including a step of stacking a p-type layer, an i-type layer and an n-type layer each made of a silicon base semiconductor, in this or reverse order, wherein the i-type layer is formed in a film forming chamber after forming an n-type layer of the same or another photoelectric conversion device.

Since n-type impurities remain in the film forming chamber after forming an n-type layer, a photoelectric conversion device in which a trace of n-type impurities is contained in the i-type layer can be attained by forming the i-type layer in this film forming chamber.

The term "an n-type layer of the same or another photoelectric conversion device" includes, for example, (1) an n-type layer contained in the same photoelectric conversion layer (composed of a set of a p-type layer, an i-type layer and an n-type layer, which are units for performing photoelectric conversion) in the same photoelectric conversion device, (2) an n-type layer contained in another photoelectric conversion layer in the same photoelectric conversion device (for example, the case of a stacked photoelectric conversion device having two or more photoelectric conversion layers), (3) an n-type layer contained in a photoelectric conversion layer in another photoelectric conversion device, and the like.

Further, the term "a film forming chamber after forming an n-type layer" includes, for example, (1) a film forming chamber just after forming an n-type layer, (2) a film forming chamber after an n-type layer is formed and then a p-type layer is formed, and the like. The reason for this is that in both cases, the n-type impurities remain in the film forming chamber similarly.

The method of producing a photoelectric conversion device of the present technology may further comprise a gas replacement step before forming the i-type layer (a first gas replacement step), of replacing an inside of the film forming chamber with a replacement gas before forming the i-type layer after forming the n-type layer.

In this case, a concentration of the n-type impurities in the i-type layer can be readily controlled.

The gas replacement step before forming the i-type layer (the first gas replacement step) may be performed in such a way that the concentration of the n-type impurities in the i-type layer is $1.0 \times 10^{16}$ to $2.0 \times 10^{17}$ cm$^{-3}$.

In this case, a photoelectric conversion device having enhanced photoelectric conversion efficiency can be obtained.

The p-type layer, the i-type layer and the n-type layer may be stacked repeatedly in this order in the same film forming chamber, the gas replacement step before forming the i-type layer (the first gas replacement step) is performed before forming the i-type layer after forming the p-type layer, and the method of producing a photoelectric conversion device of the present invention may further comprise a gas replacement step before forming the p-type layer (a second gas replacement step), of replacing the inside of the film forming chamber with a replacement gas before forming the p-type layer after forming the n-type layer.

In this case, the concentration of the n-type impurities in the i-type layer can be more readily controlled. In addition, a quantity of the n-type impurities immixed in the p-type layer can be reduced.

The gas replacement step before forming the i-type layer and the gas replacement step before forming the p-type layer (the first and the second gas replacement steps) may be performed in such a way that the concentration of the n-type impurities in the i-type layer is $1.0 \times 10^{16}$ to $2.0 \times 10^{17}$ cm$^{-3}$.

In this case, a photoelectric conversion device having enhanced photoelectric conversion efficiency can be obtained.

The p-type layer, the i-type layer and the n-type layer may be stacked repeatedly in the order of the n-type layer, the i-type layer and the p-type layer in the same film forming chamber, and the method of producing a photoelectric conversion device of the present invention may further comprise a gas replacement step before forming the n-type layer (a third gas replacement step), of replacing the inside of the film forming chamber with a replacement gas before forming the n-type layer after forming the p-type layer.

In this case, a quantity of p-type impurities immixed in the n-type layer can be reduced.

The stacking of the p-type layer, the i-type layer and the n-type layer may be performed in such a way that a plurality of sets of the p-type layer, the i-type layer and the n-type layer are continuously stacked.

In this case, a photoelectric conversion device having further enhanced photoelectric conversion efficiency can be obtained.

These various embodiments can be combined with each other.

A photoelectric conversion device of an embodiment includes a p-type layer, an i-type layer and an n-type layer each made of a silicon base semiconductor, stacked in this order, wherein the i-type layer contains n-type impurities in a concentration of $1.0 \times 10^{16}$ to $2.0 \times 10^{17}$ cm$^{-3}$.

A "silicon base semiconductor" refers to amorphous or microcrystalline silicon, or semiconductors (silicon carbide, silicon-germanium, etc.) formed by doping amorphous or microcrystalline silicon with carbon, germanium or other impurities. "Microcrystalline silicon" refers to silicon in a state of a mixed phase of crystalline silicon having a small grain size (from about several tens to 1000 Å) and amorphous silicon. Microcrystalline silicon is formed, for example, when a crystal silicon thin film is prepared at low temperatures using a non-equilibrium method such as a plasma CVD method.

The p-type layer, the i-type layer and the n-type layer may be all made of a silicon base semiconductor of the same species, or may be made of silicon base semiconductors different in species from each other. For example, the p-type layer and the i-type layer may be formed from amorphous silicon and the n-type layer may be formed from microcrystalline silicon. Further, for example, the p-type layer and the n-type layer may be formed from silicon carbide or silicon-germanium and the i-type layer may be formed from silicon.

Furthermore, the p-type, the i-type and the n-type layers may each have a monolayer structure or a multilayer structure. When the respective layers have a multilayer structure, the respective layers may be made of silicon base semiconductors different in species from each other.

Hereinafter, various embodiments will be described by use of drawings. The contents shown in the drawings and the following description are exemplification, and the scope of the present invention is not limited to the contents shown in the drawings and the following description.

1. First Embodiment

Superstrate Type Photoelectric Conversion Device

1-1. Structure of Photoelectric Conversion Device

FIG. 1 is a schematic sectional view of a photoelectric conversion device according to a first embodiment. The photoelectric conversion device of this embodiment has a structure of stacking a first electrode 3, a p-type 4, an i-type layer 5, an n-type layer 6 and a second electrode 7 on a substrate 1. The photoelectric conversion device of this embodiment is a photoelectric conversion device called a superstrate type in which the substrate 1 and the first electrode 3 have a transparent property and light enters from a substrate 1 side.

As the substrate 1, a glass substrate and a substrate of a resin such as polyimide, or the like, which have heat resistance and a transparent property in a plasma CVD forming process, can be used. As the first electrode 3, a transparent conductive film of $SnO_2$, ITO, ZnO or the like can be used.

Each of the p-type layer 4, the i-type layer 5 and the n-type layer 6 is made of a silicon base semiconductor. The p-type layer 4 is doped with p-type impurities such as boron, aluminum, or the like, and the n-type layer 6 is doped with n-type impurities such as phosphorus, or the like.

The i-type layer 5 contains n-type impurities in a concentration of $1.0 \times 10^{16}$ to $2.0 \times 10^{17}$ $cm^{-3}$. It was shown in Examples described later that by containing the n-type impurities in such a concentration, a photoelectric conversion device having excellent photoelectric conversion efficiency can be attained. In addition, the concentration of the n-type impurities in the i-type layer 5 is, for example, $1.0 \times 10^{16}$, $2.0 \times 10^{16}$, $3.0 \times 10^{16}$, $4.0 \times 10^{16}$, $5.0 \times 10^{16}$, $6.0 \times 10^{16}$, $7.0 \times 10^{16}$, $8.0 \times 10^{16}$, $9.0 \times 10^{16}$, $1.0 \times 10^{17}$, $1.1 \times 10^{17}$, $1.2 \times 10^{17}$, $1.3 \times 10^{17}$, $1.4 \times 10^{17}$, $1.5 \times 10^{17}$, $1.6 \times 10^{17}$, $1.7 \times 10^{17}$, $1.8 \times 10^{17}$, $1.9 \times 10^{17}$, or $2.0 \times 10^{17}$ $cm^{-3}$. The concentration of the n-type impurities in the i-type layer 5 may be a value between any two values exemplified above.

The second electrode 7 has a structure of stacking a transparent conductive film 7a of $SnO_2$, ITO, ZnO or the like and a film 7b of metal such as silver, aluminum or the like. The transparent conductive film 7a can be omitted.

1-2. Plasma CVD Apparatus

Figure 2:
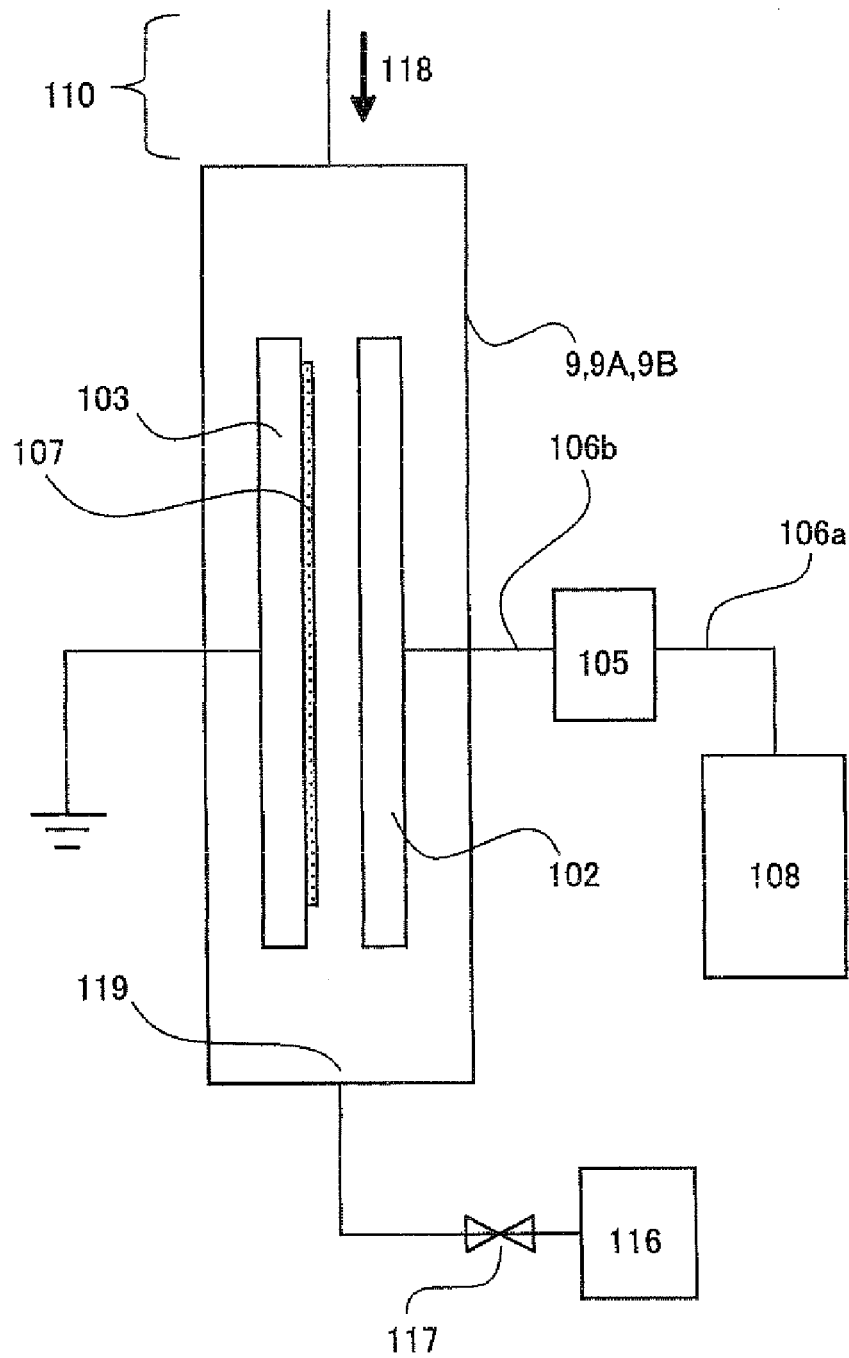
FIG. 2 is a schematic sectional view of a plasma CVD apparatus which can be used for producing photoelectric conversion devices of the first and a second embodiments.

Hereinafter, a plasma CVD apparatus for forming a semiconductor layer contained in the above-mentioned photoelectric conversion device will be described by use of FIG. 2. FIG. 2 is a schematic sectional view of the plasma CVD apparatus used for producing the photoelectric conversion device of the embodiment.

A constitution shown in FIG. 2 is an exemplification, and the semiconductor layer may be formed by use of an apparatus of another constitution. Further, the semiconductor layer may be formed by a method other than plasma CVD. Here, the plasma CVD apparatus of a single chamber in which the number of film forming chambers is one will be described as an example, but the following description is also true for a plasma CVD apparatus of a multi-chamber in which the number of film forming chambers is multiple.

As shown in FIG. 2, the plasma CVD apparatus used in this embodiment includes a film forming chamber 9 for forming a semiconductor layer therein, which can be hermetically sealed, a gas intake portion 110 for introducing a replacement gas into the film forming chamber 9, and a gas exhaust portion 116 for evacuating the replacement gas from the film forming chamber 9.

The plasma CVD apparatus shown in FIG. 2 has a parallel plate-type electrode configuration in which a cathode electrode 102 and an anode electrode 103 are installed in the film forming chamber 9 capable of being hermetically sealed. A distance between the cathode electrode 102 and the anode electrode 103 is determined depending on desired treatment conditions and it is generally several millimeters to several tens of millimeters. A power supply portion 108 for supplying electric power to the cathode electrode 102 and an impedance matching circuit 105 for matching impedances among the power supply portion 108, the cathode electrode 102 and the anode electrode 103 are installed outside the film forming chamber 9.

The power supply portion 108 is connected to one end of a power introducing line 106a. The other end of the power introducing line 106a is connected to the impedance matching circuit 105. One end of a power introducing line 106b is connected to the impedance matching circuit 105, and the other end of the power introducing line 106b is connected to the cathode electrode 102. The power supply portion 108 may output either of a CW (continuous waveform) alternating current output or a pulse-modulated (on/off control) alternating current output, or may be one capable of switching these outputs to output.

A frequency of alternating electric power outputted from the power supply portion 108 is generally 13.56 MHz, but it is not limited to this, and frequencies of several kHz to VHF band, and a microwave band may be used.

On the other hand, the anode electrode 103 is electrically grounded, and a substrate 107 is located on the anode electrode 103. The substrate 107 is, for example, the substrate 1 on which the first electrode 3 is formed. The substrate 107 may be placed on the cathode electrode 102, but it is generally located on the anode electrode 103 in order to reduce degradation of a film quality due to ion damage in plasma.

The gas intake portion 110 is provided in the film forming chamber 9. A gas 118 such as a dilution gas, a material gas, a doping gas or the like is introduced from the gas intake portion 110. Examples of the dilution gas include a gas including a hydrogen gas, examples of the material gas include silane base gases, a methane gas, a germane gas and the like. Examples of the doping gas include doping gases of a p-type impurity such as a diborane gas, and the like, and doping gases of an n-type impurity such as a phosphine gas and the like.

Further, the gas exhaust portion 116 and a pressure control valve 117 are connected in series to the film forming chamber 9, and a gas pressure in the film forming chamber 9 is kept approximately constant. It is desirable that the gas pressure is measured at a position away from the gas intake portion 110 and an exhaust outlet 119 in the film forming chamber since measurement of the gas pressure at a position close to the gas intake portion 110 and the exhaust outlet 119 causes errors a little. By supplying electric power to the cathode electrode 102 under this condition, it is possible to generate plasma between the cathode electrode 102 and the anode electrode 103 to decompose gases 118, and to form the semiconductor layer on the substrate 107.

The gas exhaust portion 116 may be one capable of evacuating the film forming chamber 9 to reduce the gas pressure in the film forming chamber 9 to a high vacuum of about $1.0 \times 10^{-4}$ Pa, but it may be one having an ability for evacuating the film forming chamber 9 to a pressure of about 0.1 Pa from the viewpoint of a simplification of an apparatus, cost reduction and an increase in throughput. A volume of the film forming chamber 9 becomes larger as a substrate size of the photoelectric conversion device is larger. When such a film forming chamber 9 is highly evacuated to a vacuum, a high-performance gas exhaust portion 16 is required, and therefore it is not desirable from the viewpoint of the simplification of an apparatus and cost reduction, and it is more desirable to use a simple gas exhaust portion 116 for a low vacuum.

Examples of the simple gas exhaust portion 116 for a low vacuum include a rotary pump, a mechanical booster pump, and a sorption pumps and it is preferable to use these pumps alone or in combination of two or more species.

The film forming chamber 9 of the plasma CVD apparatus used in this embodiment can be sized in about 1 m$^3$. As a typical gas exhaust portion 116, a mechanical booster pump and a rotary pump connected in series can be used.

1-3. Method of Producing Photoelectric Conversion Device (Single Chamber System)

Next, a method of producing the photoelectric conversion device by the single chamber system will be described. In the single chamber system, a semiconductor layer is formed by use of the plasma CVD apparatus of a single chamber. A method of producing the photoelectric conversion device by the multi-chamber system will be described later.

A method of producing a photoelectric conversion device by the single chamber system according to an embodiment comprises a step of forming a p-type layer 4, an i-type layer 5 and an n-type layer 6, in this order, on a substrate 1 on which a first electrode 3 is formed, in the same film forming chamber 9 and forming a second electrode 7 on the n-type layer 6. Further, the substrate on which the p-type layer 4, the i-type layer 5 and the n-type layer 6 are formed, is taken out from the film forming chamber 9, and another substrate (that is, the substrate 1 on which the first electrode 3 is formed) is introduced into the film forming chamber 9, and the p-type layer 4, the i-type layer 5 and the n-type layer 6 are formed on this substrate. These operations are repeated.

Here, to form the photoelectric conversion layers in the same film forming chamber 9 means that the p-type layer 4, the i-type layer 5 and the n-type layer 6 are formed by use of the same electrode or different electrodes in the same film forming chamber 9. It is desirable that the p-type layer 4, the i-type layer 5 and the n-type layer 6 are formed by use of the same electrode in the same film forming chamber 9. Further, it is desirable that the p-type layer 4, the i-type layer 5 and the n-type layer 6 are continuously formed without opening to the air on the way.

Hereinafter, the step of forming electrodes and semiconductor layers will be described in detail.

1-3-1. Step of Forming First Electrode 3

First, the first electrode 3 is formed on the substrate 1.

As the substrate 1, a glass substrate and a substrate of resin such as polyimide or the like, which have heat resistance and a transparent property in a plasma CVD forming process, can be used.

As the first electrode 3, a transparent conductive film of SnO$_2$, ITO, ZnO or the like can be used. These transparent conductive films can be formed by methods such as a CVD method, a sputtering method and a vapor deposition method.

1-3-2. Gas Replacement Step Before Forming p-Type Layer 4

Next, the substrate 1 on which the first electrode 3 is formed is installed in the film forming chamber 9, and thereafter a gas replacement step of replacing an inside of the film forming chamber 9 with a replacement gas is performed.

This gas replacement step is performed mainly for two purposes of (1) reducing the quantity of n-type impurities immixed in the p-type layer 4 and (2) controlling the quantity of n-type impurities immixed in the i-type layer 5 formed on the p-type layer 4.

(1) Reduction in Quantity of n-Type Impurities Immixed in p-Type Layer 4

In this embodiment, since the p-type layer 4, the i-type layer 5 and the n-type layer 6 are formed repeatedly, the previously formed n-type layer 6 is deposited on an inner wall and an electrode in the film forming chamber 9. Therefore, there is a problem that n-type impurities are immixed in the p-type layer 4. In order to solve the problem, in this embodiment, the gas replacement step is performed before forming the p-type layer 4 to reduce the quantity of n-type impurities immixed in the p-type layer 4. Further, by this gas replacement step, the concentration of the impurities, which enters the film forming chamber 9 from the outside when carrying a substrate to be provided with the p-type layer 4 in the film forming chamber 9, is also reduced.

By performing this gas replacement step, a semiconductor layer of good quality can be formed as the p-type layer 4. Here, since the p-type layer 4 generally contains p-type impurities in a concentration of about $1 \times 10^{20}$ cm$^{-3}$, good photoelectric conversion characteristics are attained without impairing functions as the p-type layer 4 if the concentration of immixed n-type impurities is about $1 \times 10^{18}$ cm$^{-3}$ or less which is 2 orders of magnitude lower than the concentration of the p-type impurities.

(2) Control in Quantity of n-Type Impurities Immixed in i-Type Layer 5

If the previously formed n-type layer 6 is deposited on the inner wall and the electrode in the film forming chamber 9, a trace of n-type impurities remain in the film forming chamber 9 and are incorporated in the i-type layer 5 even when forming the i-type layer 5 after forming the p-type layer 4. By adjusting conditions of the gas replacement step before forming the p-type layer 4, the concentration of a trace of n-type impurities incorporated in the i-type layer 5 can be finely adjusted.

The concentration of the n-type impurities in the i-type layer 5 ultimately depends on the quantity of the n-type impurities remaining in the film forming chamber 9 after performing the gas replacement step before forming the i-type layer described later. However, control of the concentration of the n-type impurities in the i-type layer 5 becomes easier by controlling the quantity of the remaining n-type impurities in the gas replacement step before forming the p-type layer 4.

Hereinafter, a specific method of performing the gas replacement step will be described.

The gas replacement step can be performed through an operation cycle in which for example, a hydrogen gas is introduced into the film forming chamber 9 as a replacement gas (step of introducing a replacement gas), the introduction of the hydrogen gas is stopped when the internal pressure of the film forming chamber 9 reaches a prescribed pressure (for example, about 100 Pa to 1000 Pa), and the hydrogen gas is evacuated until the internal pressure of the film forming chamber 9 reaches a prescribed pressure (for example, about 1 Pa to 10 Pa) (evacuation step). This cycle may be repeated more than once.

The time required to perform the one cycle can be several seconds to several tens of seconds. Specifically, the step of introducing a replacement gas can be performed over 1 to 5 seconds and the evacuation step can be performed over 30 to 60 seconds. Even when the steps are performed in such a short time, by repeating this cycle, the concentration of impurities in the film forming chamber 9 can be reduced. Therefore, a production method of the photoelectric conversion device of this embodiment is also practical in applying it to mass production devices.

In this embodiment, it is preferable that an internal pressure of the film forming chamber 9 after introducing a replacement gas and the internal pressure after evacuating the replacement gas are set in advance. In the step of introducing a replacement gas, the evacuation from the film forming chamber 9 is stopped and when the internal pressure of the film forming chamber 9 reaches above the internal pressure after introducing the replacement gas, the introduction of the replacement gas is stopped to terminate the step of introducing a replacement gas. In the evacuation step, the introduction of the replacement gas is stopped and when the internal pressure of the film forming chamber 9 reaches below the internal pressure after evacuating the replacement gas, the evacuation is stopped to terminate the evacuation step.

By increasing the number of repetitions of the cycles, or by decreasing a ratio (M/m) of a pressure M after evacuating the replacement gas to a pressure m after introducing the replacement gas, the concentration of impurities existing in the film forming chamber 9 can be adjusted.

Further, in this embodiment, the present technology is described taking the case of using a hydrogen gas as a replacement gas as an example, but in another embodiment, any of gases used for forming the i-type layer 5, such as a silane gas and the like, an inert gas or a mixture gas of these gases may be used as a replacement gas. Gases used for forming the i-type layer 5 are used for forming any of the p-type layer 4, the i-typle layer 5 and the n-type layer 6. Accordingly, when a gas used for forming the i-type layer 5 is used as a replacement gas, it is preferable since no impurity from this gas is immixed in the semiconductor layer. Further, as the inert gas, a gas which does not have an effect on a film quality of the semiconductor layer can be used. In particular, a gas having a large atomic weight is apt to remain in the film forming chamber 9 after evacuating the inside of the film forming chamber 9 and is suitable for a replacement gas. Examples of the inert gas include an argon gas, a neon gas, a xenon gas and the like.

1-3-3. Step of Forming p-Type Layer 4

Next, the p-type layer 4 is formed on the first electrode 3. The p-type layer 4 can be formed by the following method.

(1) Case where the p-Type Layer 4 is an Amorphous Layer

When the p-type layer 4 is an amorphous layer, the p-type layer 4 can be formed, for example, in the following formation conditions.

First, the inside of the film forming chamber 9 can be evacuated to a pressure of 0.001 Pa and a substrate temperature can be set at a temperature of 200° C. or lower. Then, the p-type layer 4 is formed. A mixture gas is introduced into the film forming chamber 9 and an internal pressure of the film forming chamber 9 is kept approximately constant by the pressure control valve 117 installed in an exhaust system. The internal pressure of the film forming chamber 9 is adjusted to, for example, 200 Pa or more and 3000 Pa or less. As the mixture gas introduced into the film forming chamber 9, for example, a gas including a silane gas, a hydrogen gas and a diborane gas can be used. Further, when it is desired that the p-type layer contains carbon atoms or germanium atoms, a gas (for example, methane) containing carbon atoms or a gas (for example, germane gas) containing germanium atoms is contained in the mixture gas introduced into the film forming chamber 9. A flow rate of the hydrogen gas is desirably about several times to several tens of times larger than that of the silane gas.

After the internal pressure of the film forming chamber 9 is stabilized, alternating electric power of several kHz to 80 MHz is inputted to the cathode electrode 102 to generate plasma between the cathode electrode 102 and the anode electrode 103, and the p-type layer 4 is formed. A power density per unit area of the cathode electrode 102 can be 0.01 W/cm$^2$ or more and 0.3 W/cm$^2$ or less.

Thus, the p-type layer 4 having a desired thickness is formed, and then input of alternating electric power is stopped and the film forming chamber 9 is evacuated to a vacuum.

(2) Case where the p-Type Layer 4 is a Microcrystalline Layer

Also when the p-type layer 4 is a microcrystalline layer, the p-type layer 4 can be formed according to a method in the case where the p-type layer 4 is an amorphous layer. However, the internal pressure of the film forming chamber 9 during forming the layer is desirably 240 Pa or more and 3600 Pa or less, and the power density per unit area of the cathode electrode 102 is desirably set at 0.01 W/cm$^2$ or more and 0.5 W/cm$^2$ or less. Further, a flow rate of the hydrogen gas is desirably about several tens of times to several hundreds of times larger than that of the silane gas in the mixture gas introduced into the film forming chamber 9, and more desirably about 30 times to 300 times.

1-3-4. Gas Replacement Step Before Forming i-Type Layer 5

Next, a gas replacement step is performed by the same method as in the gas replacement step before forming the p-type layer 4. However, various conditions such as the number of cycles of gas replacement may be appropriately changed.

Since the p-type layer 4 formed in the above-mentioned step is deposited on the inner wall and the electrode in the film forming chamber 9, there is a problem that p-type impurities are immixed in the i-type layer 5, but by performing the gas replacement step before forming the i-type layer 5, the quantity of the p-type impurities immixed in the i-type layer 5 can be reduced. Thereby, a semiconductor layer of good quality can be formed as the i-type layer 5.

As described above, the concentration of the n-type impurities in the i-type layer 5 is controlled by appropriately adjusting the conditions of the gas replacement step before forming the p-type layer 4 and the conditions of the gas replacement step before forming the i-type layer 5. In one example, the conditions of the gas replacement step before forming the i-type layer 5 are adjusted to reduce the concentration of the p-type impurities in the i-type layer 5, and then the conditions of the gas replacement step before forming the p-type layer 4 are adjusted to finely adjust the concentration of the n-type impurities in the i-type layer 5. That is, the concentration of the p-type impurities in the i-type layer 5 is reduced by the gas replacement step before forming the i-type layer 5, and after fixing these conditions, the concentration of the n-type impurities in the i-type layer 5 is finely adjusted by the gas replacement step before forming the p-type layer 4.

This gas replacement step is preferably controlled in such a way that the concentration of the n-type impurities in the i-type layer 5 preferably becomes a concentration which is 1 to 2 orders of magnitude higher than about $2.0 \times 10^{15}$ cm$^{-3}$ or less, the concentration of the n-type impurities contained in forming a silicon base semiconductor layer using a gas not containing the n-type impurities. That is, the gas replacement step is preferably controlled in such a way that the concentration of the n-type impurities in the i-type layer 5 preferably falls within a range of $1.0 \times 10^{16}$ to $2.0 \times 10^{17}$ cm$^{-3}$, and more preferably, within a range of $3.0 \times 10^{16}$ to $8.0 \times 10^{16}$ cm$^{-3}$. The reason for this is that photoelectric conversion efficiency is enhanced when the concentration of the n-type impurities in the i-type layer 5 is in such a range.

1-3-5. Step of Forming i-Type Layer 5

Next, the i-type layer 5 is formed by the same method as in the p-type layer 4. However, as a mixture gas introduced into the film forming chamber 9, for example, a gas including a silane gas and a hydrogen gas is used. Further, a thickness of the layer and conditions of forming a film may be different.

In forming the i-type layer 5, the n-type impurities remaining in the film forming chamber 9 is slightly immixed in the i-type layer 5.

By the way, in this embodiment, since the gas replacement step is performed twice for the n-type impurities and it is performed once for the p-type impurities, the concentration of the n-type impurities in the i-type layer 5 appear to be lower than that of the p-type impurities. However, actually the concentration of the p-type impurities is lower than that of the n-type impurities. This is attributed to the fact that the p-type impurities are more easily removed by the gas replacement step.

In this embodiment, the n-type impurities remaining in the film forming chamber 9 is contained in the i-type layer 5, but the n-type impurities may be contained in the i-type layer 5 by mixing a gas (for example, phosphine gas) containing n-type conductive impurity atoms in a mixture gas for forming the i-type layer 5.

1-3-6. Step of Forming n-Type Layer 6

Next, the n-type layer 6 is formed by the same method as in the p-type layer 4. However, as a mixture gas introduced into the film forming chamber 9, for example, a gas including a silane gas, a hydrogen gas and a phosphine gas is used. Further, a thickness of the layer and conditions of forming a film may be different.

1-3-7. Step of Forming Second Electrode 7

Next, the second electrode 7 is formed on the n-type layer 6. Since the second electrode 7 has the transparent conductive film 7a and the metal film 7b, these films are formed in order.

The transparent conductive film 7a is made of $SnO_2$, ITO, ZnO or the like. The metal film 7b is made of metal such as silver, aluminum or the like. The transparent conductive film 7a and the metal film 7b are formed by methods such as a CVD method, a sputtering method and a vapor deposition method. The transparent conductive film 7a can be omitted.

Thus, the step of producing the photoelectric conversion device of this embodiment is completed.

1-4. Method of Producing Photoelectric Conversion Device (Multi-Chamber System)

Next, a method of producing the photoelectric conversion device by a multi-chamber system will be described. Here, a method of producing the photoelectric conversion device by use of a plasma CVD apparatus having two film forming chambers 9 of a first film forming chamber 9A and a second film forming chamber 9B will be described.

A method of producing a photoelectric conversion device by the multi-chamber system according to an embodiment is basically identical to that of the single chamber system, but different from the single chamber system in that a p-type layer 4 is formed in the first film forming chamber 9A of the two film forming chambers 9 and an i-type layer 5 and an n-type layer 6 are formed in the second film forming chamber 9B. A substrate on which the p-type layer 4 is formed is sent from the first film forming chamber 9A to the second film forming chamber 9B, and a new substrate is introduced into the first film forming chamber 9A. The substrate sent to the second film forming chamber 9B is provided with the i-type layer 5 and the n-type layer 6 in the second film forming chamber 9B and then taken out from the second film forming chamber 9B. Thus, the p-type layer 4, the i-type layer 5 and the n-type layer 6 are formed repeatedly in the first and the second film forming chambers 9A, and 9B.

In this embodiment, since the i-type layer 5 and the n-type layer 6 are formed repeatedly in the second film forming chamber 9B and the i-type layer 5 is formed in the second film forming chamber 9B after forming the n-type layer 6, the n-type impurities deposited on the inner wall and the electrode in the second film forming chamber 9B can be introduced into the i-type layer 5.

Hereinafter, the steps of forming electrodes and semiconductor layers will be described in detail.

1-4-1. Step of Forming First Electrode 3

First, the first electrode 3 is formed on the substrate 1 by the same method as in the case of the above-mentioned single chamber system.

1-4-2. Step of Forming p-Type Layer 4

Next, the substrate 1 on which the first electrode 3 is formed is introduced in the first film forming chamber 9A, and the p-type layer 4 is formed by the same method as in the case of the single chamber system.

1-4-3. Gas Replacement Step

Next, the substrate on which the p-type layer 4 is formed is moved to a second film forming chamber 9B, and thereafter the gas replacement step is performed by the same method as in "1-3-2. Gas replacement step before forming p-type layer 4" for the second film forming chamber 9B. However, various conditions such as the number of cycles of gas replacement may be appropriately changed.

This gas replacement step is performed in order to control the concentration of the n-type impurities in the i-type layer 5. A preferable range of the concentration of the n-type impurities in the i-type layer 5 is the same as in the case of the single chamber system.

In the single chamber system, the concentration of the n-type impurities in the i-type layer 5 is controlled by adjusting the conditions of both the gas replacement step before forming the p-type layer 4 and the gas replacement step before forming the i-type layer 5, but in this embodiment, the concentration of the n-type impurities in the i-type layer 5 is controlled by adjusting only the gas replacement step before forming the i-type layer 5. And, in this embodiment, since it is not necessary to consider the p-type impurities immixed in the i-type layer 5, it is easy to set the conditions of the gas replacement step before forming the i-type layer 5.

1-4-4. Step of Forming i-Type Layer 5

Next, the i-type layer 5 is formed by the same method as in the case of the above-mentioned single chamber system in the second film forming chamber 9B.

1-4-5. Step of Forming n-Type Layer 6

Next, the n-type layer 6 is formed in the second film forming chamber 9B by the same method as in the case of the single chamber system.

1-4-6. Step of Forming Second Electrode 7

Next, the second electrode 7 is formed by the same method as in the case of the single chamber system to complete the production of the photoelectric conversion device.

1-5. Stacked Photoelectric Conversion Device

Figure 5:
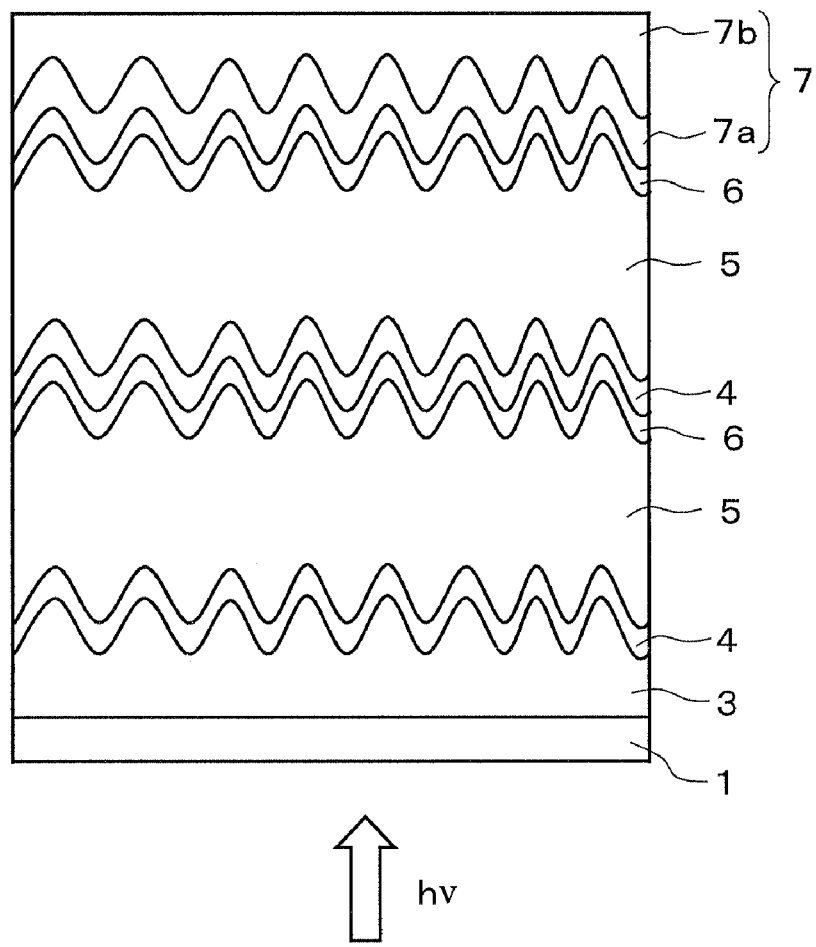
FIG. 5 is a sectional view showing another constitution of a photoelectric conversion device of the first embodiment.

Up to here, an example of producing the photoelectric conversion device having a set of the p-type layer 4, the i-type layer 5 and the n-type layer 6 has been given, but it is also possible to produce a photoelectric conversion device (stacked photoelectric conversion device) having a plurality of p-i-n junctions which are a combination of the p-type layer 4, the i-type layer 5 and the n-type layer 6 formed by stacking a plurality of sets of the p-type layer 4, the i-type layer 5 and the n-type layer 6, see FIG. 5.

(1) Case of Single Chamber System

When a stacked photoelectric conversion device is produced by the single chamber system, it is desirable to perform repeatedly a series of steps of installing the substrate 1 on which the first electrode 3 is formed in the film forming chamber 9, forming a plurality of p-i-n junctions in the film forming chamber 9, and removing a silicon semiconductor film deposited on the inside of the film forming chamber 9 by plasma etching after taking out the substrate from the film forming chamber 9. The plasma etching can be performed with gas plasma formed by converting a hydrogen gas, inert gases, fluorine cleaning gases or mixture gases containing these gases in arbitrary proportions to plasma, but fluorine cleaning gases such as nitrogen trifluoride and the like are preferably used in that an etching rate of a residual film is relatively fast.

For example, when a mixture gas of 10% by volume to 30% by volume of nitrogen trifluoride gas and 90% by volume to 70% by volume of argon gas is introduced as an etching gas and plasma discharge is performed at a pressure of 300 Pa or less, an etching rate of 10 nm/s or more is attained. It is desirable that after thus cleaning the cathode, a silicon film is preliminarily deposited (predeposition) on the surface of the cathode to stabilize the surface of the cathode and a step of forming the p-i-n junction semiconductor layer is continued again.

By removing the film deposited on the inside of the film forming chamber 9 by etching every time a plurality of p-i-n junction semiconductor layers are formed, an atmosphere of the film forming chamber 9 before forming the p-i-n junction semiconductor layer can be kept approximately constant every time. Therefore, the concentration of the n-type impurities incorporated in the i-type layer can be kept approximately constant, and the production yield of the stacked photoelectric conversion device can be improved.

In addition) in this case, if a gas (for example, phosphine gas) containing n-type impurities is not mixed in a mixture gas for forming the i-type layer 5, the n-type impurities cannot be contained in the i-type layer in a p-i-n junction formed first on the first electrode 3. However, n-type impurities can be contained in the i-type layer in p-i-n junctions stacked secondarily or later even when the gas containing n-type impurities is not mixed in the mixture gas. Consequently, a stacked photoelectric conversion device having good photoelectric conversion efficiency can be produced.

(2) Case of Multi-Chamber System

When a stacked photoelectric conversion device is produced by the multi-chamber system, it is desirable to perform repeatedly a series of steps of installing the substrate 1 on which the first electrode 3 is formed in the first film forming chamber 9A, forming a plurality of p-i-n junctions by repeating the formation of the p-type layer 4 in the first film forming chamber 9A and the formation of the i-type layer 5 and the n-type layer 6 in the second film forming chamber 9B twice or more, and removing a silicon semiconductor film deposited on the inside of the second film forming chamber 9B by plasma etching after taking out the substrate from the second film forming chamber 9B. Conditions of plasma etching and treatment of the electrode after plasma etching are the same as those in the single chamber system.

Since the etching is performed after the completion of the formation of a plurality of p-i-n junctions of each stacked photoelectric conversion device, if a gas (for example, phosphine gas) containing n-type impurities is not mixed in a mixture gas, the n-type impurities cannot be immixed in the i-type layer 5 of a photoelectric conversion layer being a first layer. However, the n-type impurities can be contained in the i-type layer 5 of a second or thereafter photoelectric conversion layer even when the gas containing n-type impurities is not mixed in the mixture gas. Consequently, a stacked photoelectric conversion device having good photoelectric conversion efficiency can be produced.

2. Second Embodiment

Figure 3:
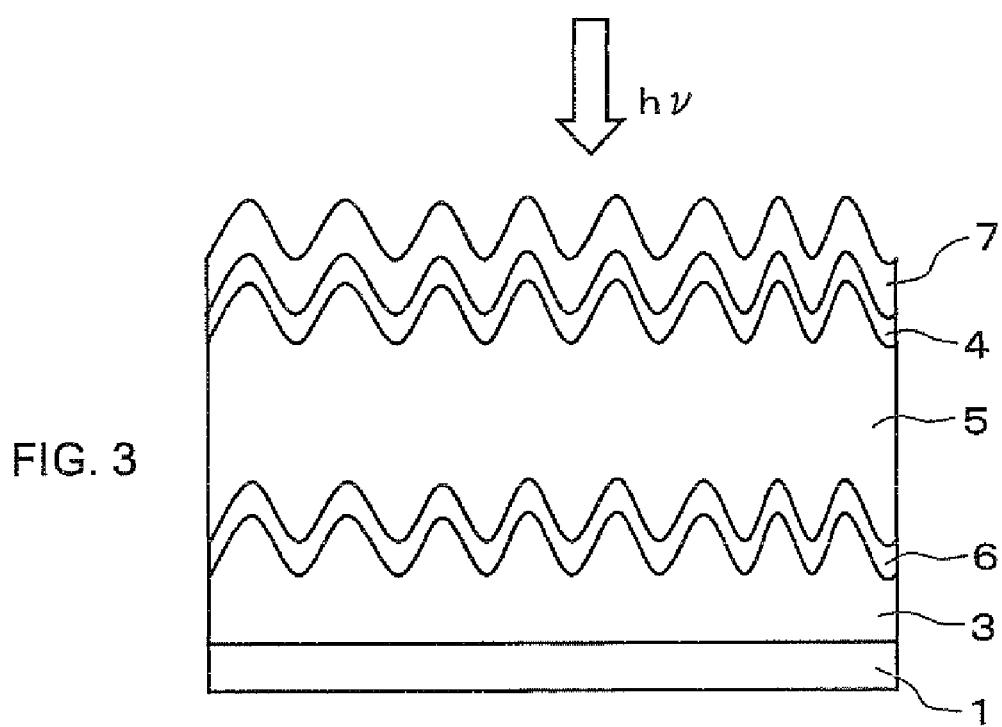
FIG. 3 is a sectional view showing a constitution of the photoelectric conversion device of the second embodiment.

Substrate Type Photoelectric Conversion Device 2-1. Structure of Photoelectric Conversion Device FIG. 3 shows a schematic sectional view of a photoelectric conversion device according to a second embodiment. The photoelectric conversion device of this embodiment has a structure of stacking a first electrode 3, an n-type layer 6, an i-type layer 5, a p-type layer 4, and a second electrode 7 on a substrate 1. The photoelectric conversion device of this embodiment is a photoelectric conversion device called a substrate type in which the substrate 1 or the first electrode 3 is composed of a material not having a transparent property, and light enters from a second electrode 7 side having a transparent property. The substrate 1 or the first electrode 3 has a function of reflecting light entering from the second electrode 7 side and passing through the p-type layer 4, the i-type layer 5 and the n-type layer 6.

As the substrate 1, a glass substrate, a substrate of a resin such as polyimide, or the like, and a substrate of a metal such as stainless steel or the like, which have heat resistance in a plasma CVD forming method, can be used.

As the first electrode 3, a metal such as silver, aluminum or the like, a transparent conductive film of $SnO_2$, ITO, ZnO or the like, or a stacked layer thereof is used.

The constitution of the n-type layer 6, the i-type layer 5 and the p-type layer 4 is the same as that of the first embodiment.

As the second electrode 7, a transparent conductive film of $SnO_2$, ITO, ZnO or the like can be used.

2-2. Plasma CVD Apparatus

The photoelectric conversion device of this embodiment can be produced by use of the same plasma CVD apparatus as that in the first embodiment.

2-3. Method of Producing Photoelectric Conversion Device (Single Chamber System)

Next, a method of producing the photoelectric conversion device by the single chamber system will be described. In the single chamber system, a semiconductor layer is formed by use of the plasma CVD apparatus of a single chamber. A method of producing the photoelectric conversion device by the multi-chamber system will be described later.

A method of producing a photoelectric conversion device by the single chamber system according to an embodiment comprises the step of forming an n-type layer 6, an i-type layer 5 and a p-type layer 4, in this order, on a substrate 1 on which a first electrode 3 is formed in the same film forming chamber 9 and forming a second electrode 7 on the p-type layer 4. Further, the substrate on which the n-type layer 6, the i-type layer 5 and the p-type layer 4 is formed, is taken out from the film forming chamber 9, and another substrate (that is, the substrate 1 on which the first electrode 3 is formed) is introduced into the film forming chamber 9, and the n-type layer 6, the i-type layer 5 and the p-type layer 4 are formed on this substrate. These operations are repeated.

Here, to form the photoelectric conversion layers in the same film forming chamber 9 means that the n-type layer 6, the i-type layer 5 and the p-type layer 4 are formed by use of the same electrode or different electrodes in the same film forming chamber 9. It is desirable that the n-type layer 6, the i-type layer 5 and the p-type layer 4 are formed by use of the same electrode in the same film forming chamber 9. Further, it is desirable that the n-type layer 6, the i-type layer 5 and the p-type layer 4 are continuously formed without opening to the air on the way.

2-3-1. Step of Forming First Electrode 3

First, the first electrode 3 is formed on the substrate 1 made of stainless steel or the like. The first electrode 3 can be formed by methods such as a CVD method, a sputtering method and a vapor deposition method. The first electrode 3 can be formed by use of a metal material such as silver, aluminum or the like or a transparent material such as $SnO_2$, ITO, ZnO or the like.

2-3-2. Gas Replacement Step

Next, the substrate 1 on which the first electrode 3 is formed is installed in the film forming chamber 9, and thereafter the gas replacement step of replacing an inside of the film forming chamber 9 with a replacement gas is performed. This gas replacement step can be performed by the same method as in "1-3-2. Gas replacement step before forming p-type layer 4". However, various conditions such as the number of cycles of gas replacement may be appropriately changed.

In this embodiment, since the n-type layer 6, the i-type layer 5 and the p-type layer 4 are formed repeatedly, the previously formed p-type layer 4 is deposited on the inner wall and the electrode in the film forming chamber 9. Therefore, there is a problem that p-type impurities are immixed in the n-type layer 6. In order to solve the problem, in this embodiment, the gas replacement step is performed before forming the n-type layer 6 to reduce the quantity of p-type impurities immixed in the n-type layer 6. Further, by this gas replacement step, the concentration of the impurities, which enters the film forming chamber 9 from the outside when carrying a substrate to be provided with the n-type layer 6 in the film forming chamber 9, is also reduced.

By performing this gas replacement step, a semiconductor layer of good quality can be formed as the n-type layer 6. Here, since the n-type layer 6 generally contains n-type impurities in a concentration of about $1 \times 10^{20}$ cm$^{-3}$, good photoelectric conversion characteristics are attained without impairing functions as the n-type layer 6 if the concentration of immixed p-type impurities is about $1 \times 10^{18}$ cm$^{-3}$ or less which is 2 orders of magnitude lower than the concentration of the n-type impurities.

2-3-3. Step of Forming n-Type Layer 6

Next, the n-type layer 6 is formed on the first electrode 3 by the same method as in the first embodiment.

2-3-4. Gas Replacement Step

Next, the gas replacement step is performed by the same method as in "1-3-2. Gas replacement step before forming p-type layer 4". However, various conditions such as the number of cycles of gas replacement may be appropriately changed.

This gas replacement step is performed in order to control the concentration of the n-type impurities in the i-type layer 5. A preferable range of the concentration of the n-type impurities in the i-type layer 5 is the same as in the first embodiment.

2-3-5. Step of Forming i-Type Layer 5

Next, the i-type layer 5 is formed by the same method as in the first embodiment.

2-3-6. Step of Forming p-Type Layer 4

Next, the p-type layer 4 is formed by the same method as in the first embodiment.

2-3-7. Step of Forming Second Electrode 7

Next, the second electrode 7 is formed on the p-type layer 4. The second electrode 7 can be formed by methods such as a CVD method, a sputtering method and a vapor deposition method using a transparent material such as $SnO_2$, ITO, ZnO or the like.

2-4. Method of Producing Photoelectric Conversion Device (Multi-Chamber System)

Next, a method of producing the photoelectric conversion device by a multi-chamber system will be described. Here, a method of producing the photoelectric conversion device by use of a plasma CVD apparatus having two film forming chambers 9 of a first film forming chamber 9A and a second film forming chamber 9B will be described.

A method of producing a photoelectric conversion device by the multi-chamber system according to an embodiment is basically identical to that of the single chamber system, but different from the single chamber system in that an n-type layer 6 and an i-type layer 5 are formed in the first film forming chamber 9A and a p-type layer 4 is formed in the second film forming chamber 9B. The substrate on which the n-type layer 6 and the i-type layer 5 have been formed is sent from the first film forming chamber 9A to the second film forming chamber 9B, and a new substrate is introduced into the first film forming chamber 9A. A substrate sent to the second film forming chamber 9B is provided with the p-type layer 4 in the second film forming chamber 9B and then taken out from the second film forming chamber 9B. Thus, the n-type layer 6, the i-type layer 5 and the p-type layer 4 are formed repeatedly in the first and the second film forming chambers 9A, and 9B.

In this embodiment, since the n-type layer 6 and the i-type layer 5 are formed repeatedly in the first film forming chamber 9A and the i-type layer 5 is formed in the first film forming chamber 9A after the n-type layer 6, the n-type impurities deposited on the inner wall and the electrode in the first film forming chamber 9A can be introduced into the i-type layer 5.

Hereinafter, the steps of forming electrodes and semiconductor layers will be described in detail.

2-4-1. Step of Forming First Electrode 3

First, the first electrode 3 is formed on the substrate 1 by the same method as in the case of the above-mentioned single chamber system.

2-4-2. Step of Forming n-Type Layer 6

Next, the substrate 1 on which the first electrode 3 is formed is introduced in the first film forming chamber 9A, and the n-type layer 6 is formed by the same method as in the case of the above single chamber system.

2-4-3. Gas Replacement Step

Next, the gas replacement step is performed by the same method as in the case of the single chamber system for the first film forming chamber 9A. However, various conditions such as the number of cycles of gas replacement may be appropriately changed.

2-4-4. Step of Forming i-Type Layer 5

Next, the i-type layer 5 is formed by the same method as in the case of the single chamber system in the first film forming chamber 9A.

2-4-5. Step of Forming p-Type Layer 4

Next, the substrate on which the i-type layer 5 is formed is moved to the second film forming chamber 9B, and thereafter the p-type layer 4 is formed by the same method as in the case of the single chamber system.

2-4-6. Step of Forming Second Electrode 7

Figure 6:
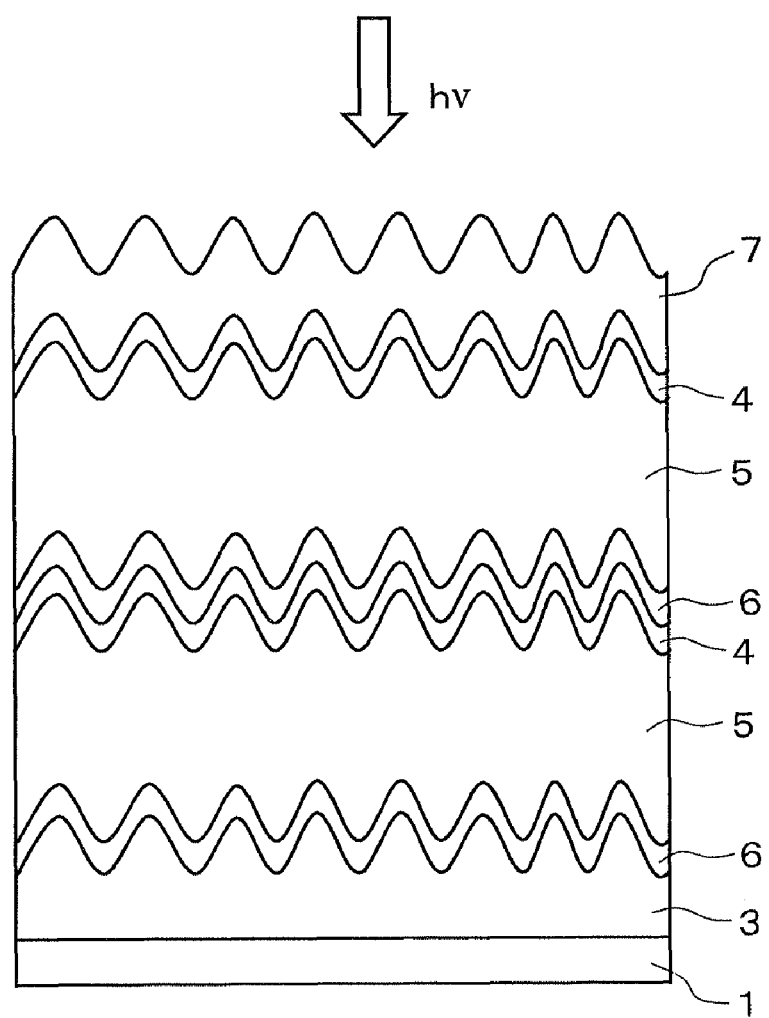
FIG. 6 is a section view showing another constitution of a photoelectric conversion device of the second embodiment.

Next, the second electrode 7 is formed by the same method as in the case of the single chamber system to complete the production of the photoelectric conversion device 2-5. Stacked Photoelectric Conversion Device Up to here, an example of producing the photoelectric conversion device having a set of the n-type layer 6, the i-type layer 5 and the p-type layer 4 has been given, but it is also possible to produce a photoelectric conversion device (stacked photoelectric conversion device) having a plurality of p-i-n junctions which are a combination of the n-type layer 6, the i-type layer 5 and the p-type layer 4 formed by stacking a plurality of sets of the n-type layer 6, the i-type layer 5 and the p-type layer 4, see FIG. 6.

(1) Case of Single Chamber System

When a stacked photoelectric conversion device is produced by the single chamber system, it is desirable to perform repeatedly a series of steps of installing the substrate 1 on which the first electrode 3 is formed in the film forming chamber 9, forming a plurality of p-i-n junctions in the film forming chamber 9, and removing a silicon semiconductor film deposited on the inside of the film forming chamber 9 by plasma etching after taking out the substrate from the film forming chamber 9. Conditions of plasma etching and treatment of the electrode after plasma etching can be the same as in the first embodiment.

By performing this step, the film deposited on the inside of the film forming chamber 9 is removed through etching every time a plurality of p-i-n junction semiconductor layers are formed, and therefore an atmosphere of the film forming chamber 9 before forming the p-i-n junction semiconductor layer can be kept approximately constant every time. Accordingly, the concentration of the n-type impurities incorporated in the i-type layer in each p-i-n junction can be kept approximately constant, and the production yield of the stacked photoelectric conversion device can be improved.

(2) Case of Multi-Chamber System

When a stacked photoelectric conversion device is produced by the multi-chamber system, the substrate 1 on which the first electrode 3 is formed is installed in the first film forming chamber 9A, and a plurality of p-i-n junctions are formed by repeating the formation of the n-type layer 6 and the i-type layer 5 in the first film forming chamber 9A and the formation of the p-type layer 4 in the second film forming chamber 9B twice or more. It is desirable to perform repeatedly a series of steps of removing a silicon semiconductor film deposited on the inside of the first film forming chamber 9A by plasma etching after forming a plurality of p-i-n junctions in addition to the above-mentioned steps. Conditions of plasma etching and treatment of the electrode after plasma etching can be the same as in the first embodiment.

In addition, in this embodiment, in the photoelectric conversion device having a set of the n-type layer 6, the i-type layer 5 and the p-type layer 4, a identical or similar effect can also be attained by performing the plasma etching every time one p-i-n junction is formed in the order of the n-type layer 6, the i-type layer 5 and the p-type layer 4.

Hereinafter, Examples and Comparative Examples of the present technology will be described.

EXAMPLES

1. Method of Producing Photoelectric Conversion Device

In Examples 1 to 5 and Comparative Example 1, a photoelectric conversion device having a structure of a superstrate type identical to the first embodiment, shown in FIG. 1, was produced by use of the plasma CVD apparatus of a single chamber system having a film forming chamber 9 shown in FIG. 2. A film forming chamber 9 of the plasma CVD apparatus used in this Example has an internal size of 1 m×1 m×50 cm. A p-type layer 4, an i-type layer 5 and an n-type layer 6 were continuously formed by use of the same electrode in the same film forming chamber 9 without opening to the air. Further, the gas replacement step was performed using a hydrogen gas before forming the p-type layer 4 and before forming the i-type layer 5.

In Examples 1 to 5 and Comparative Example 1, a substance (produced by Asahi Glass Co., Ltd., trade name: Asahi-U), which was prepared by forming a film of $SnO_2$ having projections and depressions of surface as a first electrode 3 on a glass substrate being the substrate 1 by thermal CVD, was used, and a photoelectric conversion device was formed thereon according to the following step. Hereinafter, a method of forming the p-type layer 4, the i-type layer 5 and the n-type layer 6 will be described in detail.

1-1. Step of Installing Substrate

First, the glass substrate on which a film of $SnO_2$ was formed was installed in the film forming chamber 9 of the plasma CVD apparatus and a substrate temperature was set at 200° C.

1-2. Gas Replacement Step

Next, a gas replacement step was performed by following the procedure below. First, the inside of the film forming chamber 9 was evacuated with a vacuum pump until the internal pressure of the film forming chamber 9 reached 0.5 Pa. Next, a hydrogen gas was introduced into the film forming chamber 9 as a replacement gas (step of introducing a replacement gas), and the introduction of the hydrogen gas was stopped when the internal pressure of the film forming chamber 9 reached a pressure m after introducing the replacement gas, and then the hydrogen gas was evacuated with the vacuum pump until the internal pressure of the film forming chamber 9 reached a pressure M after evacuating the replacement gas (evacuation step). Gas replacement was performed by repeating this cycle including the step of introducing a replacement gas and the evacuation step X times.

In Examples 1 to 5 and Comparative Example 1, the pressure m after introducing the replacement gas, the pressure M after evacuating the replacement gas and the number X of cycles were set at values shown in Table 1.

TABLE 1

| | Pressure m after introducing replacement gas (Pa) | Pressure M after evacuating replacement gas (Pa) | Number X of cycles |
|---|---|---|---|
| Example 1 | 100 | 10 | 7 |
| Example 2 | 100 | 10 | 6 |
| Example 3 | 100 | 10 | 5 |
| Example 4 | 100 | 10 | 4 |
| Example 5 | 100 | 10 | 3 |
| Comparative Example 1 | 100 | 10 | 2 |

1-3. Step of Forming p-Type Layer 4

Next, a p-type layer 4 was formed by the following method. Further, a mixture gas consisting of $SiH_4$ gas, an $H_2$ gas and a $B_2H_6$ gas was introduced into the film forming chamber 9, and an internal pressure of the film forming chamber 9 was kept approximately constant by a pressure control valve 117. The internal pressure of the film forming chamber 9 was set at 1000 Pa. A mixture gas to be introduced into the film forming chamber 9 was composed of an $SiH_4$ gas/a $B_2H_6$ gas (diluted with hydrogen so as to have a concentration of 0.1%) of 150 sccm/30 sccm, respectively, and a flow rate ratio of an $H_2$ gas to an $SiH_4$ gas was 150. After the internal pressure of the film forming chamber 9 was stabilized, alternating electric power of 13.56 MHz was inputted to the cathode electrode 102 to generate plasma between the cathode electrode 102 and the anode electrode 103, and a p-type microcrystalline silicon layer was formed as the p-type layer 4. A power density per unit area of the cathode electrode 102 was 0.15 W/cm$^2$, and the p-type microcrystalline silicon layer having a film thickness of 40 nm was formed.

1-2. Gas Replacement Step

Next, a gas replacement step was performed by following the procedure below. First, the inside of the film forming chamber 9 was evacuated with a vacuum pump until the internal pressure of the film forming chamber 9 reached 0.5 Pa. Next, a hydrogen gas was introduced into the film forming chamber 9 as a replacement gas (step of introducing a replacement gas), and the introduction of the hydrogen gas was stopped when the internal pressure of the film forming chamber 9 reached 100 Pa, and then the hydrogen gas was evacuated with the vacuum pump until the internal pressure of the film forming chamber 9 reached 10 Pa (evacuation step). The gas replacement was performed by repeating this cycle including the step of introducing a replacement gas and the evacuation step 6 times.

Conditions of this gas replacement step were set in such a way that a concentration of boron of a p-type impurity in an approximately stable portion in the i-type layer 5 is $2 \times 10^{16}$ cm$^{-3}$ or less, and the concentration of boron at an interface portion between the p-type layer 4 and the i-type layer 5 is $1 \times 10^{17}$ cm$^{-3}$ or less. In addition, since the pressure m after introducing the replacement gas, the pressure M after evacuating the replacement gas and the number X of cycles in the gas replacement step vary in optimum values depending on a volume, a configuration and an internal electrode structure of the film forming chamber 9, the apparatus-by-apparatus adjustment is necessary.

1-5. Step of Forming i-Type Layer 5

Next, an i-type microcrystalline silicon layer was formed as an i-type layer 5 on the p-type layer 4. The i-type microcrystalline silicon layer was formed under conditions of a temperature of the substrate 1 of 200° C., an internal pressure of the film forming chamber 9 of plasma CVD of 2000 Pa, a power density per unit area of the cathode electrode of 0.15 W/cm$^2$, a mixture gas to be introduced into the film forming chamber 9 composed of an SiH$_4$ gas of 250 sccm and a flow rate ratio of an H$_2$ gas to an SiH$_4$ gas of 100, and its layer thickness was adjusted to 3 µm.

1-6. Step of Forming n-Type Layer 6

Next, an n-type microcrystalline silicon layer was formed as the n-type layer 6 on the i-type layer 5. The n-type microcrystalline silicon layer was formed under conditions of a temperature of the substrate 1 of 200° C., an internal pressure of the film forming chamber 9 of plasma CVD of 2000 Pa, a power density per unit area of the cathode electrode of 0.15 W/cm$^2$, a mixture gas to be introduced into the film forming chamber 9 composed of an SiH$_4$ gas/PH$_3$ gas (diluted with hydrogen so as to have a concentration of 1%) of 150 sccm/30 sccm, respectively, and a flow rate ratio of an H$_2$ gas to an SiH$_4$ gas of 150, and its layer thickness was adjusted to 40 nm.

1-7. Step of Forming Second Electrode 7

Next, a second electrode 7 was formed by stacking ZnO having a film thickness of 50 nm and Ag having a film thickness of 100 nm by a sputtering method to produce a photoelectric conversion device.

2. Comparative Example 2

As Comparative Example 2, a photoelectric conversion device, in which a p-type layer 4, an i-type layer 5 and an n-type layer 6 were formed in different film forming chambers 9, respectively by use of the same formation conditions as in Example 2, was produced.

3. Measurement of Photoelectric Conversion Efficiency

Photoelectric conversion efficiency was measured on each of photoelectric conversion devices of Examples 1 to 5 and Comparative Examples 1 and 2.

A light-receiving area of each photoelectric conversion device was 1 cm$^2$, and a current-voltage characteristic photoelectric conversion efficiency under the irradiation condition of AM 1.5 (100 mW/cm$^2$) was measured.

4. SIMS Measurement

Figure 4:
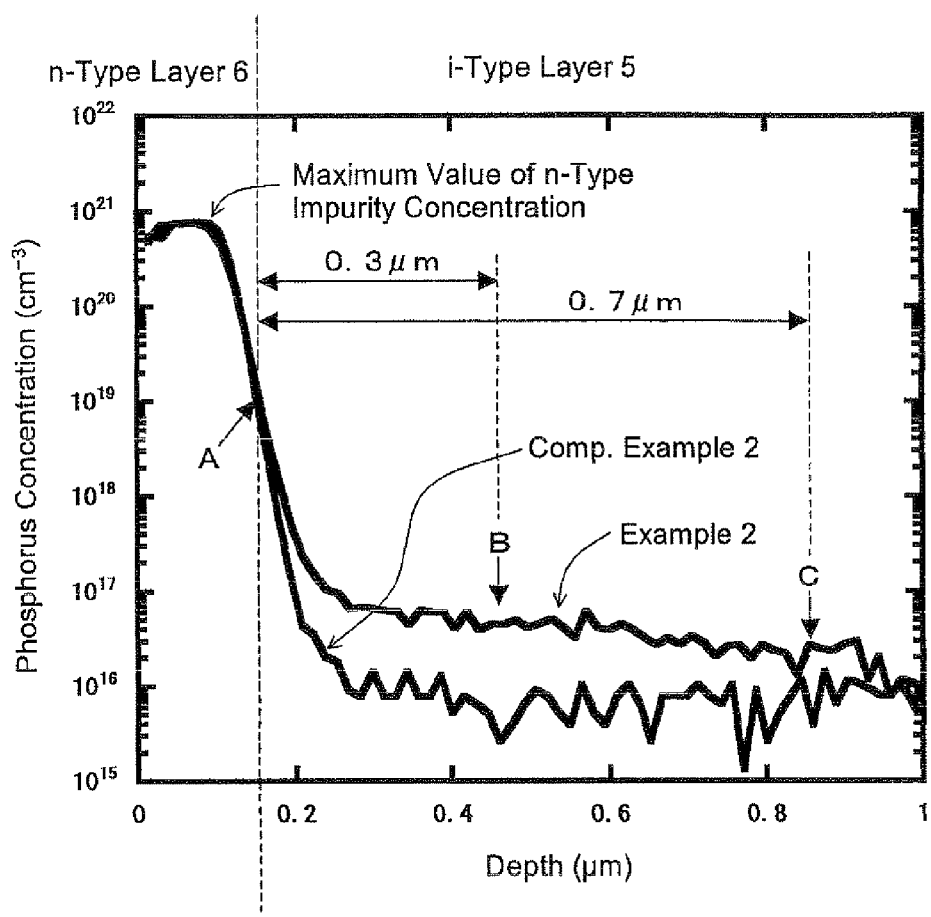
FIG. 4 is a graph of SIMS measurements measured on Example 2 and Comparative Example 2.

Concentrations of n-type impurities (phosphorus) in the i-type layer 5 and the n-type layer 6 were measured on each of photoelectric conversion devices of Examples 1 to 5 and Comparative Examples 1 and 2 by a secondary ion mass spectrometry (SIMS) method. The results of Example 2 and Comparative Example 2 are shown in FIG. 4. It is understood from FIG. 4 that a phosphorus concentration in the i-type layer 5 is $3.0 \times 10^{16}$ cm$^{-3}$ in Example 2 and $7.0 \times 10^{15}$ cm$^{-3}$ in Comparative Example 2. In addition, the concentration of the n-type impurities in the i-type layer 5 means an average of the concentration of the n-type impurities in an approximately stable portion in the i-type layer 5. Specifically, in the case where a film thickness of the i-type layer 5 is 1 µm or more, if a depth, where the concentration of n-type impurities near the interface between the n-type layer 6 and the i-type layer 5 becomes a value which is 2 orders of magnitude lower than the maximum value, is taken as a point A, an average of concentrations measured between a position (point B) 0.3 µm deep from the point A toward the i-type layer 5 and a position (point C) 0.7 µm deep from the point A toward the i-type layer 5 can be considered as a "concentration of the n-type impurities in the i-type layer 5". Further, in the case where a film thickness of the i-type layer 5 is 1 µm or less, if a depth, where the concentration of n-type impurities near the interface between the n-type layer 6 and the i-type layer 5 becomes a value which is 2 orders of magnitude lower than the maximum value, is taken as a point A and a depth, where the concentration of p-type impurities near the interface between the p-type layer 4 and the i-type layer 5 becomes a value which is 2 orders of magnitude lower than the maximum value, is taken as a point D, an average of the concentrations of n-type impurities within a range of ±(5% of a distance between the points A and D) around a midpoint between the points A and D can be considered as a "concentration of the n-type impurities in the i-type layer 5".

5. Summary of Measurement Result

Measurement results of the phosphorus concentration in the i-type layer 5 and the photoelectric conversion efficiency of Examples 1 to 5 and Comparative Examples 1 and 2 are summarized in Table 2.

TABLE 2

| | Phosphorus concentration in i-type layer (cm$^{-3}$) | Photoelectric conversion efficiency (%) |
|---|---|---|
| Example 1 | $1.0 \times 10^{16}$ | 8.9 |
| Example 2 | $3.0 \times 10^{16}$ | 9.0 |

TABLE 2-continued

|  | Phosphorus concentration in i-type layer (cm$^{-3}$) | Photoelectric conversion efficiency (%) |
|---|---|---|
| Example 3 | $5.0 \times 10^{16}$ | 9.1 |
| Example 4 | $8.0 \times 10^{16}$ | 9.2 |
| Example 5 | $2.0 \times 10^{17}$ | 9.0 |
| Comparative Example 1 | $3.0 \times 10^{17}$ | 7.8 |
| Comparative Example 2 | $8.0 \times 10^{15}$ | 8.7 |

It is understood from Table 2 that the photoelectric conversion efficiency is improved compared with Comparative Examples in a n-type impurity (phosphorus) concentration in the i-type layer 5 of $1.0 \times 10^{16}$ to $2.0 \times 10^{17}$ cm$^{-3}$, the photoelectric conversion efficiency is particularly high in a n-type impurity concentration of $3.0 \times 10^{16}$ to $8.0 \times 10^{16}$ cm$^{-3}$, and it is sharply decreased when the n-type impurity concentration is $2.0 \times 10^{17}$ cm$^{-3}$ or higher. Therefore, it can be said from Table 2 that the n-type impurity concentration in the i-type layer 5 in a range of $1.0 \times 10^{16}$ to $2.0 \times 10^{17}$ cm$^{-3}$ is desirable, and the concentration in a range of $3.0 \times 10^{16}$ to $8.0 \times 10^{16}$ cm$^{-3}$ is more desirable from the viewpoint of the photoelectric conversion efficiency.

The reason why the results shown in Table 2 were obtained is not necessarily clear, but the present inventors estimate that these results result from an internal electric field of the i-type layer 5 enhanced by addition of the n-type impurities. The reason is as follows.

In accordance with the simulation, an open circuit voltage of the photoelectric conversion layer in the case where a carrier concentration in an amorphous or microcrystalline i-type layer 5 is about $1.0 \times 10^{16}$ cm$^{-3}$ is higher than that in the case where a carrier concentration is $2.0 \times 10^{15}$ cm$^{-3}$ (refer to K. Yamamoto et al., Journal of Non-Crystalline Solids, 266-269 (2000), 1082-1087).

Further, concentrations of the n-type impurities and the carrier in the amorphous or microcrystalline i-type layer 5 were measured, and consequently the carrier concentration in a sample 1 having a phosphorus concentration of $7.0 \times 10^{15}$ cm$^{-3}$ was $1.0 \times 10^{15}$ cm$^{-3}$, and the carrier concentration in a sample 2 having a phosphorus concentration of $10 \times 10^{17}$ cm$^{-3}$ was $1.0 \times 10^{16}$ cm$^{-3}$. The phosphorus concentration was measured by the same method as in the Examples above. The carrier concentration was measured by use of a Hall measuring method. As for measuring samples, only the i-type layer 5 is deposited on a glass substrate, and four electrodes were formed thereon based on a Van der Pauw method. The electrodes were formed by a vacuum deposition method of aluminum. As a Hall measuring apparatus, RESITEST 8300 manufactured by TOYO Corporation was employed.

Referring to the above measured results of the samples 1 and 2 and the above simulation, it is predicted that the open circuit voltage of the sample 2 is higher than that of the sample 1. Further, it is thought that the open circuit voltage is enhanced by the enhanced internal electric field of the i-type layer 5. In addition, it is thought that photoelectric conversion efficiency is increased when the open circuit voltage is enhanced.

The phosphorus concentration of the sample 1 is close to that of Comparative Example 2, and the phosphorus concentration of the sample 2 is close to those of Examples 1 to 5. Therefore, it is estimated that the reason why photoelectric conversion efficiency of Examples 1 to 5 is higher than that of Comparative Example 2 is that the internal electric field of the i-type layer 5 is enhanced by addition of the n-type impurities in Examples 1 to 5 and therefore the open circuit voltage is enhanced and photoelectric conversion efficiency is increased.

What is claimed is:

1. A method of producing a photoelectric conversion device comprising a step of stacking a p-type layer, an i-type layer and an n-type layer each made of a silicon base semiconductor, in this order, wherein the i-type layer is formed in a film forming chamber after forming an n-type layer of the same or another photoelectric conversion device; and
    a gas replacement step of replacing an inside gas of the film forming chamber with a replacement gas after forming the n-type layer of the same or another photoelectric conversion device but before forming the i-type layer, wherein
    the gas replacement step is performed in such a way that a concentration of the n-type impurities in the i-type later becomes $1.0 \times 10^{16}$ to $2.0 \times 10^{17}$ cm$^{-3}$.

2. The method of claim 1, wherein the stacking of the p-type layer, the i-type layer and the n-type layer is performed in such a way that a plurality of sets of the p-type layer, the i-type layer and the n-type layer are continuously stacked.

3. A method of producing a photoelectric conversion device comprising:
    a step of stacking a p-type layer, an i-type layer and an n-type layer each made of a silicon base semiconductor, in this order in the same film forming chamber, wherein the i-type layer is formed in a film forming chamber after forming an n-type layer of the same or another photoelectric conversion device;
    a first gas replacement step of replacing an inside gas of the film forming chamber with a replacement gas after forming the p-type layer but before forming the i-type layer; and
    a second gas replacement step of replacing the inside of the film forming chamber with a replacement gas after forming the n-type layer of the same or another photoelectric conversion device but before forming the p-type layer, wherein
    the first gas replacement step and the second gas replacement step are performed in such a way that a concentration of the n-type impurities in the i-type layer becomes $1.0 \times 10^{16}$ to $2.0 \times 10^{17}$ cm$^{-3}$.

4. A method of producing a photoelectric conversion device comprising:
    a step of stacking an n-type layer, an i-type layer and a p-type layer each made of a silicon base semiconductor, in this order in a film forming chamber, wherein the i-type layer is formed in the film forming chamber after forming the n-type layer;
    a first gas replacement step of replacing an inside gas of the film forming chamber with a replacement gas before forming the n-type layer; and
    a second gas replacement step of replacing an inside gas of the film forming chamber with a replacement gas after forming the n-type layer but before forming the i-type layer, wherein
    the first gas replacement step and the second gas replacement step are performed in such a way that a concentration of the n-type impurities in the i-type layer becomes $1.0 \times 10^{16}$ to $2.0 \times 10^{17}$ cm$^{-3}$.

5. A method of producing a photoelectric conversion device comprising:
    a step of stacking an n-type layer, an i-type layer and a p-type layer each made of a silicon base semiconductor, in this order, wherein the i-type layer is formed in a film forming chamber after forming the n-type layer; and a gas replacement step of replacing an inside gas of the film forming chamber with a replacement gas after forming the n-type layer but before forming the i-type layer, wherein the gas replacement step is performed in such a way that a concentration of the n-type impurities in the i-type layer becomes $1.0 \times 10^{16}$ to $2.0 \times 10^{17}$ cm$^{-3}$.

* * * * *